United States Patent [19]

Himoto

[11] Patent Number: 4,673,593

[45] Date of Patent: Jun. 16, 1987

[54] PROCESS FOR FORMING AN OHMIC ELECTRODE ON A P-TYPE III-V COMPOUND SEMICONDUCTOR

[75] Inventor: Takeshi Himoto, Osaka, Japan

[73] Assignee: Sumitomo Electric Industries Ltd., Osaka, Japan

[21] Appl. No.: 708,052

[22] Filed: Mar. 4, 1985

[30] Foreign Application Priority Data

Mar. 7, 1984 [JP] Japan ................................ 59-43634

[51] Int. Cl.4 ......................................... H01L 21/285
[52] U.S. Cl. .......................................... 427/89; 427/91
[58] Field of Search ..................................... 427/89, 91

[56] References Cited

U.S. PATENT DOCUMENTS

| | | | |
|---|---|---|---|
| 3,987,480 | 10/1976 | Diguet | 357/68 |
| 4,395,727 | 7/1983 | Lauterbach | 357/71 |
| 4,414,561 | 11/1983 | Keramidas | 427/89 |
| 4,471,005 | 9/1984 | Cheng | 427/89 |
| 4,510,514 | 4/1985 | Camlibel | 427/89 |

FOREIGN PATENT DOCUMENTS

| | | |
|---|---|---|
| 55-32213 | 8/1980 | Japan. |
| 55-120132 | 9/1980 | Japan. |
| 59-9965 | 1/1984 | Japan. |

OTHER PUBLICATIONS

Su et al, "Low Contact Resistance Nonalloyed Ohmic Contacts to Zn-implanted p+GaAs", Electronic Letters, vol. 19, (1983), Oct., pp. 891–892.

Primary Examiner—John D. Smith
Attorney, Agent, or Firm—Cushman, Darby and Cushman

[57] ABSTRACT

A semiconductor device having an ohmic electrode which has formed on the surface of a p-type III-V compound semiconductor an assembly of a first Ti layer, a second Zn layer, a third metal layer made of one element selected from among Pt, Mo, W and Cr, and a fourth Au layer is disclosed. A process for producing such semiconductor device is also disclosed.

The present invention provides a novel ohmic electrode having a low contact resistance comparable to that of a conventional electrode formed by deposition of successive Au, Zn and Au layers. The novel electrode also has the advantage of another conventional electrode wherein the Au electromigration is held to a minimum by forming an assembly of a Ti layer, a metal layer made of an element selected from among Pt, Mo, W and Cr, and an Au layer.

2 Claims, 3 Drawing Figures

PROCESS FOR FORMING AN OHMIC ELECTRODE ON A P-TYPE III-V COMPOUND SEMICONDUCTOR

The present invention relates to a semiconductor device and a process for producing the same. More particularly, the invention relates to an ohmic electrode formed on a p-type III-V compound semiconductor, and a process for producing such electrode.

Figure 1:
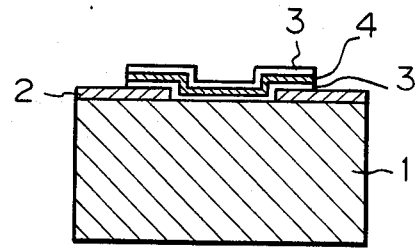
Figure 2:
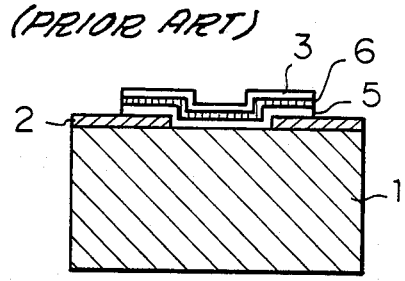

Conventional ohmic electrodes on a compound semiconductor are illustrated in FIGS. 1 and 2. The electrode in FIG. 1 comprises a p-type III-V compound semiconductor substrate 1 which is overlaid successively with an insulating or protective $SiO_2$ or $Si_3N_4$ film 2, a first metal (Au) layer 3, a second metal (Zn) layer 4 and a third metal (Au) layer 3. The electrode in FIG. 2 consists of a p-type III-V compound semiconductor substrate 1 which is successively overlaid with a first metal (Ti) layer 5, a second metal layer 6 made of one element selected from among Pt, Mo, W and Cr, and a third metal (Au) layer 3.

The electrode in FIG. 1 exhibits a low contact resistance because Au forms an alloy layer with both the semiconductor and Zn. However, the electromigration of Au atoms into the bulk of the semiconductor impairs the characteristics of the device using the electrode and eventually shortens its service life. Another disadvantage is that the $SiO_2$ or $Si_3N_4$ film adheres so poorly to the Au layer that the electrode easily separates from the semiconductor substrate. The electrode in FIG. 2 has no such defects; first, it minimizes the electromigration of Au atoms by a barrier layer 6 which is made of one metal selected from among Pt, Mo, W or Cr that will not easily form an alloy with Au; secondly, the electrode separation is prevented by forming a Ti layer 5 which has good adhesion to the $SiO_2$ or $Si_3N_4$ film 2. However, this electrode does no.t have a low contact resistance comparable to that of the electrode shown in FIG. 1 since Ti does not easily alloy with the semicondctor.

The primary object of the present invention is to provide an electrode which has a low contact resistance comparable to that of the electrode in FIG. 1 and which is free from Au electromigration as in the electrode in FIG. 2.

The electrode in accordance with the present invention comprises a p-type III-V semiconductor which has successively formed thereon a Ti layer, a Zn layer, a layer made of one metal selected from among Pt, Mo, W and Cr, and an Au layer. The thickness of the Ti layer, as well as the temperature and period of alloying between Zn and the semiconductor are so selected that Zn in the second layer penetrates through the Ti layer to form an alloy layer with the semiconductor. Because of the presence of this alloy layer, the electrode of the present invention exhibits low contact resistance.

Figure 3:
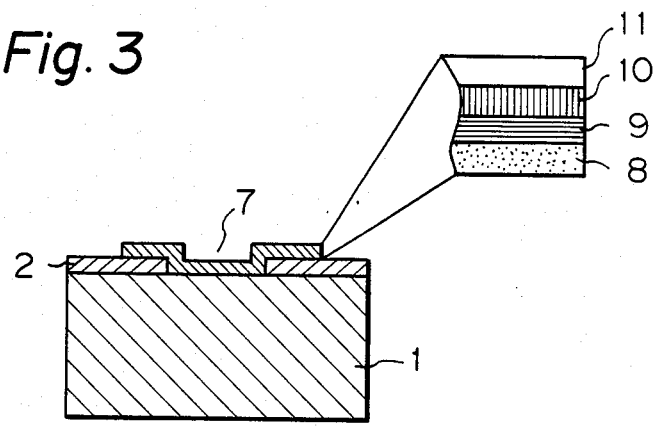

FIGS. 1 and 2 show cross sections of two conventional electrodes on a p-type III-V semiconductor; and FIG. 3 is a cross section of the electrode of the present invention on a p-type III-V semiconductor.

The ohmic electrode of the present invention is illustrated in FIG. 3. A p-type III-V semiconductor substrate which is generally shown at 1 is made of a single layer of GaAs, ZnP, InGaAs or InGaAsP or a lamination of such layers. An insulating and protective film 2 of $SiO_2$, $Si_3N_4$ or $Al_2O_3$ is formed on the semiconductor substrate by a suitable thin-film forming technique such as CVD or sputtering. A window 7 is cut in the protective film 2 by photolithography. A metal layer assembly in accordance with the present invention is deposited on the semiconductor substrate showing in the window and the protective layer around the window. An enlarged view of the metal layer assembly is shown on the upper right side of FIG. 3. The assembly contains a first thin metal (Ti) layer 8 which is formed by vacuum evaporation or sputtering. Above the Ti layer are formed a Zn layer 9, a Mo layer 10 and an Au layer 11. Each of these layers is formed by the same method used in depositing the Ti layer, and has a thickness in the range of 100 Å to 1 $\mu$m.

The reasons for assembling the four metal layers in a lamination are shown below. The Ti layer 8 has good adherence to the $SiO_2$ or $SiO_3N_4$ film 2 and is inserted in order to prevent electrode separation from the semiconductor substrate. The Zn layer 9 is formed so that, as a result of alloying following the electrode fabrication, Zn diffuses through the Ti layer to reach the semiconductor surface where it forms an alloy layer with the semiconductor, thereby ensuring a low contact resistance for the electrode. The Ti layer 8 must be thin enough (e.g., 50 Å) to facilitate the transfer of Zn through that layer. The Mo layer 10 is used to minimize the electromigration of Au atoms from the Au layer 11 since Mo is a high-melting metal and does not easily form an alloy with Au. The topmost Au layer 11 is provided for the purpose of facilitating the subsequent die bonding and wire bonding.

After forming these metal layers, those portions which are not used as the electrode are removed by the combination of photolithographic techniques and chemical etching, plasma etching or lifting-off.

Subsequently, the device is subjected to heat treatment either in a gaseous atmosphere made of $H_2$, $N_2$, Ar or mixtures thereof or in vacuum, so that Zn atoms in the second layer 9 penetrate through the Ti layer to reach the surface of the p-type III-V compound semiconductor and form a layer made of a Zn alloy with this semiconductor.

As shown above, the electrode of the present invention has a Zn layer formed on the Ti layer rn the conventional type of electrode shown in FIG. 2. By properly selecting the thickness of the Ti layer and the alloying conditions, Zn atoms penetrate through the Ti layer to form an alloy layer on the surface of the semiconductor substrate. The electrode of the present invention so constructed has a low contact resistance comparable to that of the conventional electrode shown in FIG. 1 and, at the same time, the Au electromigration which occurs in the conventional electrode in FIG. 2 is held to a minimum.

Having the advantages shown above, the present invention provides a novel ohmic electrode suitable for use with light-emitting diodes, light-receiving diodes and other semiconductor devices using semiconducting compounds such as GaAs and InP.

What is claimed is:

1. A process for producing a semiconductor device comprising the following steps:

forming on surface of a p-type III-V compound semiconductor in sequence a first ti layer having a thickness of less than 100 Å, a second Zn layer, a third metal layer made of one element selected from the group consisting of Pt, Mo, W and Cr, and a fourth Au layer;

heat-treating the assembly either in a gaseous atmosphere made of $H_2$, $N_2$, Ar or a mixture thereof or in a vacuum so that Zn in the second layer penetrates through the first Ti layer to reach the surface of the semiconductor, thereby forming a layer of an alloy of said semiconductor with Zn.

2. A process for producing a semiconductor device as claimed in claim 1, wherein said first Ti layer has a thickness of approximately Å.

* * * * *

UNITED STATES PATENT AND TRADEMARK OFFICE
CERTIFICATE OF CORRECTION

PATENT NO. : 4,673,593
DATED : June 16, 1987
INVENTOR(S) : Takeshi HIMOTO

It is certified that error appears in the above-identified patent and that said Letters Patent is hereby corrected as shown below:

Column 1, line 4 from the bottom, "ZnP" should read --InP--;

Column 2, line 16, "SiO$_3$N$_4$" should read --Si$_3$N$_4$--;

Column 2, line 44, "rn" should read --in--;

Column 2, line 53, "FIG 2" should read --FIG 1--;

Column 2, line 64, "ti" should read --Ti--; and

Column 4, line 5, "Å" should read --50Å--.

Signed and Sealed this

Twelfth Day of January, 1988

Attest:

DONALD J. QUIGG

*Attesting Officer*  *Commissioner of Patents and Trademarks*